US010006936B2

(12) United States Patent
Boday et al.

(10) Patent No.: US 10,006,936 B2
(45) Date of Patent: Jun. 26, 2018

(54) POLY(THIOAMINAL) PROBE BASED LITHOGRAPHY

(71) Applicant: International Business Machines Corporation, Armonk, NY (US)

(72) Inventors: Dylan J. Boday, Tucson, AZ (US); Jeannette M. Garcia, San Leandro, CA (US); James L. Hedrick, Pleasanton, CA (US); Rudy J. Wojtecki, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/601,504

(22) Filed: May 22, 2017

(65) Prior Publication Data
US 2017/0261534 A1 Sep. 14, 2017

Related U.S. Application Data

(62) Division of application No. 14/954,398, filed on Nov. 30, 2015, now Pat. No. 9,862,802.

(51) Int. Cl.
| | | |
|---|---|---|
| *G01Q 80/00* | (2010.01) | |
| *C08G 16/02* | (2006.01) | |
| *C08G 73/02* | (2006.01) | |
| *C08G 75/10* | (2006.01) | |
| *C08G 75/23* | (2006.01) | |
| *C08G 75/00* | (2006.01) | |
| *C08G 14/06* | (2006.01) | |
| *C08G 12/06* | (2006.01) | |
| *C08G 75/04* | (2016.01) | |
| *C08G 12/08* | (2006.01) | |
| *G03F 7/00* | (2006.01) | |

(52) U.S. Cl.
CPC ............ *G01Q 80/00* (2013.01); *C08G 12/06* (2013.01); *C08G 12/08* (2013.01); *C08G 14/06* (2013.01); *C08G 16/02* (2013.01); *C08G 16/0237* (2013.01); *C08G 73/0253* (2013.01); *C08G 75/00* (2013.01); *C08G 75/04* (2013.01); *C08G 75/10* (2013.01); *C08G 75/23* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 2,191,753 | A | 2/1940 | Coffman et al. |
| 2,889,277 | A | 6/1959 | Hughes |
| 3,340,232 | A | 9/1967 | Smith et al. |
| 3,598,748 | A | 8/1971 | Hirosawa |
| 3,957,742 | A | 5/1976 | Kveton |
| 4,086,211 | A | 4/1978 | Nakauchi et al. |
| 4,106,904 | A | 8/1978 | Oude Alink et al. |
| 4,224,417 | A | 9/1980 | Hajek et al. |
| 4,225,481 | A | 9/1980 | Wagner |
| 4,246,160 | A | 1/1981 | Wagner et al. |
| 4,301,262 | A | 11/1981 | Wagner et al. |
| 4,839,460 | A | 6/1989 | Molzahn |
| 4,877,451 | A | 10/1989 | Winnik et al. |
| 5,112,796 | A | 5/1992 | Iannicelli |
| 5,354,453 | A | 10/1994 | Bhatia |
| 5,554,349 | A | 9/1996 | Rivers et al. |
| 5,674,377 | A | 10/1997 | Sullivan, III et al. |
| 5,795,560 | A | 8/1998 | Reed |
| 5,830,243 | A | 11/1998 | Wolak et al. |
| 5,958,352 | A | 9/1999 | Callaway et al. |
| 6,132,933 | A | 10/2000 | Nguyen |
| 6,419,945 | B1 | 7/2002 | Gresser et al. |
| 6,541,181 | B1 | 4/2003 | Levanon et al. |
| 6,566,035 | B1 | 5/2003 | Aoshima |
| 6,641,978 | B1 | 11/2003 | Chapman et al. |
| 6,663,841 | B2 | 12/2003 | Salma et al. |
| 6,911,300 | B2 | 6/2005 | Sato et al. |
| 7,384,434 | B2 | 6/2008 | Malfer et al. |
| 7,652,119 | B2 | 1/2010 | Wakabayashi et al. |
| 7,989,146 | B2 | 8/2011 | Burberry et al. |
| 8,389,205 | B2 | 3/2013 | Duerig et al. |
| 8,450,043 | B2 | 5/2013 | Coady et al. |
| 8,562,964 | B2 | 10/2013 | Ljubimova et al. |
| 8,574,815 | B2 | 11/2013 | Coady et al. |
| 8,632,947 | B2 | 1/2014 | Bentley et al. |

(Continued)

FOREIGN PATENT DOCUMENTS

| | | |
|---|---|---|
| CN | 101265255 A | 9/2008 |
| CN | 101343421 A | 1/2009 |

(Continued)

OTHER PUBLICATIONS

Hua "Materials and methods for nanolithography using scanning thermal cantilever probes", Thesis Georgia Institute of Technology 199 pages (May 2008).*
Low et al., "Structural effects of phenols on the thermal and thermo-oxidative degradation of polybenzoxazines", Polymer vol. 40 pp. 4365-4376 (1999).*
U.S. Appl. No. 15/334,156 entitled "Polymers From Stabilized Imines,", filed Oct. 25, 2016.
U.S. Appl. No. 15/287,419 entitled "High Molecular Weight Polythioaminals From a Single Monomer,", filed Oct. 6, 2016.
U.S. Appl. No. 14/952,488 entitled "Polythioaminal Dispersions and Coatings,", filed Nov. 25, 2015.
U.S. Appl. No. 15/249,218 entitled "Polymers From Stabilized Imines,", filed Aug. 26, 2016.

(Continued)

*Primary Examiner* — Martin J Angebranndt
(74) *Attorney, Agent, or Firm* — Patterson + Sheridan, LLP

(57) ABSTRACT

Methods and materials for patterning a substrate are disclosed herein. A poly(thioaminal) material may be utilized as a thermal resist material for patterning substrates in a thermal scanning probe lithography process. The poly(thioaminal) material may be functionalized with an electron withdrawing group and various monomers may be volatilized upon exposure to a thermal scanning probe.

20 Claims, No Drawings

(56) References Cited

U.S. PATENT DOCUMENTS

| | | |
|---|---|---|
| 9,120,897 B1 | 9/2015 | Boday et al. |
| 9,228,059 B2 | 1/2016 | Boday et al. |
| 9,388,281 B2 | 7/2016 | Boday et al. |
| 9,534,084 B1 | 1/2017 | Boday et al. |
| 9,550,863 B1 | 1/2017 | Boday et al. |
| 2003/0039689 A1 | 2/2003 | Chen et al. |
| 2004/0060405 A1 | 4/2004 | Kao |
| 2007/0077511 A1 | 4/2007 | Tredwell et al. |
| 2009/0039018 A1 | 2/2009 | Jordi et al. |
| 2009/0250659 A1 | 10/2009 | Gatlin |
| 2010/0048756 A1 | 2/2010 | Loccufier et al. |
| 2010/0107476 A1 | 5/2010 | Cosimbescu |
| 2010/0312004 A1* | 12/2010 | Gorodisher ........... C07C 323/25 560/16 |
| 2011/0271096 A1 | 11/2011 | Bharrat et al. |
| 2012/0049308 A1 | 3/2012 | Nishimura et al. |
| 2012/0232328 A1 | 9/2012 | Gwenin et al. |
| 2014/0013425 A1 | 1/2014 | Samson |
| 2014/0031500 A1 | 1/2014 | Matsumura et al. |
| 2017/0049902 A1 | 2/2017 | Hedrick et al. |

FOREIGN PATENT DOCUMENTS

| | | |
|---|---|---|
| EP | 473542 A1 | 3/1992 |
| EP | 2636697 A1 | 9/2013 |
| GB | 535577 A | 4/1941 |
| GB | 928112 A | 6/1963 |
| GB | 942932 A | 11/1963 |
| GB | 1531578 A | 11/1978 |
| JP | 2006516548 A | 7/2006 |
| JP | 2006519766 A | 8/2006 |
| WO | 0166614 A2 | 9/2001 |
| WO | 0198388 A1 | 12/2001 |
| WO | 0226849 A1 | 4/2002 |
| WO | 2004060405 A2 | 7/2004 |
| WO | 2014179100 A1 | 11/2014 |

OTHER PUBLICATIONS

Gavin O. Jones et al., Computational and Experimental Studies on the Mechanism of Formation of Poly(hexahydrotriazine)s and Poly(hemiaminal)s from the Reactions of Amines with Formaldehyde: Organic Letters, 2014, 5502-5505, American Chemical Society, USA. [Abstract Only].

Katrin Knop, Richard Hoogenboom, Dagmar Fischer, and Ulrich S. Schubert, Poly(ethyleneglycol) in Drug Delivery: Pros and Cons as Well as Potential Alternatives. Angewandte Chemie, 2010, 6288-6308, Wiley-VCH Verlag GrnbH & Co. KGaA Weinheirn. [Abstract Only].

Stuart J. Rowan, Stuart J. Cantrill, Graham R L Cousins, Jeremy K. M. Sanders, and J. Fraser Stoddart, Dynamic Covalent Chemistry, Angew. Chem. Int. Ed. 2002, 41, 898 ± 952, Wiley-VCH Verlag GmbH, 69451 Weinheim, Germany. [Abstract Only].

Jeannette M. Garcia et al., Recyclable, Strong Thermosets and Organogels via Paraformaldehyde Condensation with Diamines. Science, 344, 132 (2014), American Association for the Advancement of Science, USA.

G. Saito et al. Advanced Drug Delivery Reviews 55 (2003) 199-215, Elsevier Science B.V., USA. [Abstract Only].

Rudy J. Wojtecki, Michael A. Meador and Stuart J. Rowan, Using the Dynamic Bond to Access Macroscopically Responsive Structurally Dynamic Polymers, Mature Materials vol. 10 Jan. 2011, Macmillan Publiers Limited, USA. [Abstract Only].

Zhu et al. (Journal of Polymer Science: Part A: Polymer Chemistry, vol. 40, 1321-1333 (2002)). [Abstract Only].

Henri Ulrich et al. Reaction of Chloromethyl Ether with Primary Amines, May 1961, pp. 1637-1638.

Hemant S. Patel et al., Studies on Synthesis and Characterization of some Novel Aromatic Copolyesters based on s-Triazine, Iranian Polymer Journal, vol. 14, No. 12, 2005, pp. 1090-1098.

Fabin Suriano et al. Functionalized cyclic carbonates: from synthesis and metal-free catalyzed ring-opening polymerization to applications, Polymer Chemistry, The Royal Society of Chemistry, 2011, Received Jul. 6, 2010, Accepted Aug. 13, 2010, pp. 528-533.

Hydrogen Sulfide Management. Mitigation options in petroleum refining, storage and transportation, White Paper, Baker Hughes, pp. 1-12.

Wang Yulan et al., Synthesis and Properties of Poly-1, 3, 5-Triazines, Polymer Communications, No. 2, 1984, pp. 117-123.

John Markoff, Error at IBM Lap Finds New Famiiy of Materials, New York Times, May 15, 2014, 4 pages.

D. R. Anderson et al., Thermally resistance polymers containing the S-friazine ring, Journal of Polymer Science Part A-1: PolyrnerO;ernistry, vol. 4, Issue 7, pp. 1689-1702.

Ekinci et al., "Preparation, Characterization and H202 Selectivity of Hyperbranched Polyimides Containing Triazine". Journal of Polymer Research, 2005, pp. 205-210.

Raquel Lebrero et al.. Odor abatement in biotrickling filters: Effect of the EBRT on methyl mercaptan and hydrophobic VOCs removal, Bioresource Technology, Special Issue: Innovative Researches on Algal Biomass. vol. 109, Apr. 2012, pp. 38-45.

Elbert, et al. "Conjugate Addition Reactions Combined with Free-Radical Cross-Linking for the Design of Materials or Tissue Engineering," Biomacromolecules 2001, 2. 430-441; Published on Web Mar. 3, 2001.

Ferrar, "Reactions of Formaldehyde With Aromatic Amines," J. Appl. Chem, 14, 1964, 389-399.

Geng, et al., "Nanoindentation behavior of ultrathin polymeric films," Polymer 46 (2005) 11768-1 1772; Available Online Oct. 19, 2005.

Hiller, et al. "Laser-engraveable hexahydrotriazine polymer networks," Mat Res Innovat (2002) 6: 179-184.

Oliver, et al. "Measurement of hardness and elastic modulus by; instrumented indentation: Advances in understanding and; refinements to methodology," J. Mater. Res., vol. 19, No. 1, .Jan. 2004, 3-20.

Singh, et al., "Ultrasound mediated Green Synthesis of Hexa-hydro Triazines," J. Mater. Environ. Sci. 2 (4) (2011) 103-406.

Stafford, et al., "A buckiing-based metrology for measuring; the elastic moduli of poiymeric thin films," Nature Materials_3_AUGUST 2004, 545-550; Published online: Jul. 11, 2004.

* cited by examiner

POLY(THIOAMINAL) PROBE BASED LITHOGRAPHY

BACKGROUND

Field

Embodiments of the present disclosure generally relate to polymers utilized in nanoscale patterning processes. More specifically, embodiments described herein relate to poly (thioaminal) probe based lithography.

Description of the Related Art

Transistors and other electronic device structures are generally formed on semiconductor and other substrate types during micro-electronic fabrication processes. To manufacture such devices, various patterning processes are utilized to facilitate device fabrication. The patterning of resist materials at the submicron scale (i.e. nanoscale) and the corresponding transfer of patterns onto various underlying substrates are foundational technologies for micro and nano fabrication processes. Conventional patterning processes, such as optical lithography and the like, are considered to be approaching scaling limits for advanced technology nodes.

Thermal scanning probe lithography is a promising candidate for extending nanolithographical processes. The technique utilizes a nanoscale heated scanning probe microscope tip which is positioned in contact with a thermally sensitive resist material. The resist material is volatilized upon contact resulting in a void formed on the resist material. Current resist materials include thermally sensitive polymers, such as polyphthalaldehyde (PPA) or the like, which exhibit desirable depolymerization into volatile monomers in response to thermal stimulus. However, current resist materials often generate undesirable residual materials upon volatilization which may deposit on the probe tip and adversely affect lithographic resolution during patterning processes. Moreover, current resist materials are unstable and may decompose in acidic environments which may prevent efficient preparation of resist materials. In addition, current resist materials suitable for thermal scanning probe lithography often exhibit less than desirable etch selectivity which may negatively influence subsequent etching processes post patterning.

Accordingly, there is a need in the art for improved resist materials for thermal scanning probe lithographical processes.

SUMMARY

In one embodiment, a method of patterning a substrate is provided. The method includes disposing a poly(thioaminal) material on a substrate and patterning the poly(thioaminal) material with a thermal scanning probe.

In another embodiment, a method of patterning a substrate is provided. The method includes disposing a poly (thioaminal) material on a substrate. The poly(thioaminal) material may have a C—N—C—S—R—S repeating group or an S—C—N—R—N—C repeating group and each instance of R may be independently selected from the group consisting of alkyl, aryl, and oligomer. R' may be an electron withdrawing group and the poly(thioaminal) material may be patterned with a thermal scanning probe.

In yet another embodiment, a thermal resist material is provided. The material includes a poly(thioaminal) thermal resist material having a C—N—C—S—R—S repeating group or an S—C—N—R—N—C repeating group. Each instance of R may be independently selected from the group consisting of alkyl, aryl, and oligomer and R' may be an electron withdrawing group.

DETAILED DESCRIPTION

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Similarly, the terms "further comprises," "may further comprise," and "further comprising," when used in this specification, specify the presence of additional features or components, without precluding the presence or addition of other features or components. The terms "further comprises," "may further comprise", and "further comprising" in this specification do not mean that any features or components are excluded from any embodiments. When a range is used to express a possible value using two numerical limits a and b (e.g., a concentration of a ppm to b ppm), unless otherwise stated the value can be a, b, or any number between a and b.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and their practical application, and to enable others of ordinary skill in the art to understand the disclosure.

Poly(thioaminal) materials described herein may be utilized in performing thermal scanning probe lithography processes. Poly(thioaminal) materials formed by thioaminal polymer synthesis schemes described below may generally be expressed as follows:

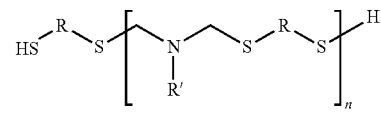

Poly(Thioaminal) Synthesis Schemes

In one embodiment, the poly(thioaminal) material may be formed by reacting a hexahydrotriazine ("HT") with a thiol resulting in the following structure:

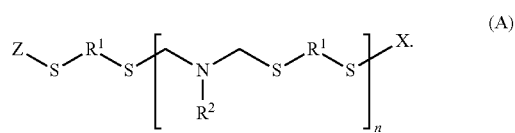

(A)

This polymer (A) may be formed according to the following general reaction scheme:

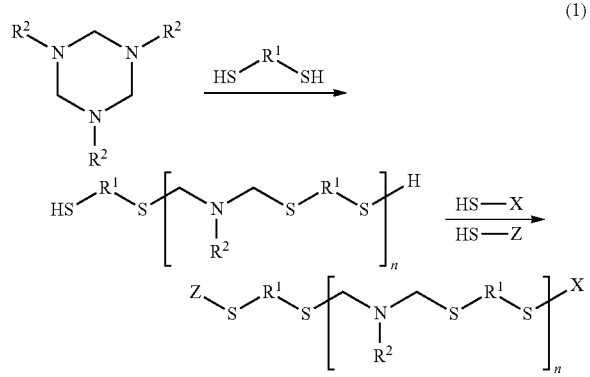

(1)

In this scheme, each instance of $R^1$ is independently an organic or hetero-organic group. In some cases, each instance of $R^1$ may be the same species. Each instance of $R^2$ is independently an organic or hetero-organic group that may have a molecular weight of not more than about 120 Daltons, and each instance of $R^2$ may be the same species. In certain embodiments, $R^2$ may be materials having a molecular weight of greater than about 120 Daltons. For example, $R^2$ may include cyclic carbonates and anhydrides, such as propylene carbonates and succinic anhydride. X and Z are each, independently, a sulfur-bonded species, and n is an integer greater than or equal to 1. In each instance, $R^1$ may be a hydrocarbon species, an aromatic and/or aliphatic; a polymer species such as polyethylene glycol, polyol species; or polyether species, any of which may have non-hydrogen substituents, as governed by the dithiols used in the reaction scheme. In one embodiment, at least one instance of $R^1$ is polyethylene glycol. In another embodiment, each instance of $R^1$ is the same species.

Alkane dithiols such as butane dithiol, pentane dithiol, and hexane dithiol may be used as precursors. Aromatic dithiols such as benzene dithiol, toluene dithiol, and xylene dithiol may also be used as precursors. The dithiol may be a polymer species, such as a dithiol-capped polyolefin. Dithio-polyol species may also be used, such as dithio-alkane diols, triols, and the like. Each instance of $R^2$ may independently be hydrogen, fluorine, methyl, or an alkyl group such as ethyl, propyl, butyl, hexyl, or cyclohexyl.

Reaction scheme (1) begins with the following polymerization reaction:

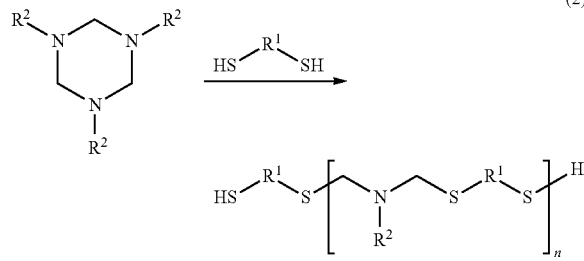

(2)

In reaction (2), an HT is reacted with a dithiol, or a mixture of dithiols, to form a poly(thioaminal), with $R^1$ and $R^2$ as described above. The reaction may be performed in a solvent medium such as N-methyl pyrrolidone (NMP), or other suitable solvent, to control viscosity. An example of such reaction is the reaction between 1,3,5-trimethylhexahydrotriazine and hexanedithiol, as follows:

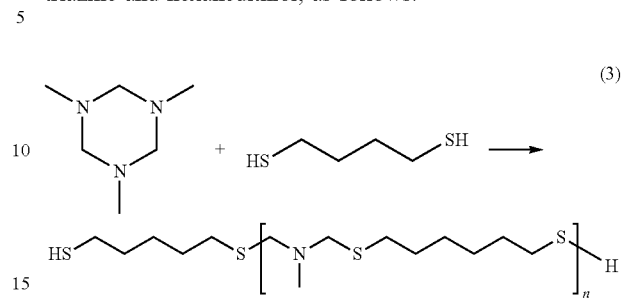

(3)

Reaction (3) may be performed using NMP as solvent, or using the reactants alone as solvent. For example, the reaction (3) may be performed in excess triazine up to about 2 equivalents, such as from 1.3 to 1.5 equivalents, for example about 1.3 equivalents. The precursors may be obtained from commercial suppliers such as Sigma-Aldrich, or may be synthesized.

Reaction (3) may be performed according to the following exemplary process. In a stirred vessel, the dithiol precursor is added to 1.3 equivalents of the triazine precursor. The vessel is purged with nitrogen or other inert gas and sealed, and the reaction mixture is heated to 85° C. The reaction mixture is maintained at 85° C. for 18 hours to form oligomers. Vacuum is then applied to the vessel to remove volatile byproducts, driving growth in molecular weight of the resulting polymer molecules according to LeChatelier's Principle. The reaction is allowed to proceed for 24 hours, during which stirring may cease due to viscosity of the mixture. The resulting polymer is typically optically transparent and may range from a solid to a viscous liquid.

In another embodiment, poly(thioaminal) material may be formed having the general structure and repeat unit:

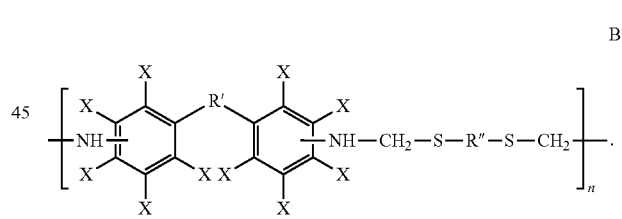

B

The polymer (polymer B) as shown, is an example of a poly(thioaminal), a sulfur containing polymer, which is subset of the polyaminals (PAs), or polymers that contain at least one aminal group or linkage. In the case of polymer B, the aminal group or segment is —NH—CH$_2$—S—, wherein a carbon atom is covalently bonded to a first and a second heteroatom, such as N and S. In polymer B, the aminal segment —NH—CH$_2$—S—, is a part of the larger —NH—CH$_2$—S—R''—S—CH$_2$— segment or linkage shown in the repeat unit. In an expansion beyond the current state of polyaminal synthesis, the sulfur atom of polymer B may be substituted or replaced by a different heteroatom, which may be abbreviated as "Nuc" (as in nucleophile). Nuc is a nucleophilic heteroatom, neutral or negatively charged, and may be selected from the group consisting of: Si, Ge, Sn, N, P, As, Sb, O, S, Se, Te. For example, in some embodiments, a difunctional alcohol or alkoxide compound may be used to synthesize a polymer similar to polymer B, and the heteroatom is thus integrated into a larger aminal comprising segment or linkage such as —NH—CH$_2$—O—R"—O—CH$_2$—. Likewise, if an organic dithiol is used, an aminal comprising segment or linkage comprising —NH—CH$_2$—S—R"—S—CH$_2$— is produced.

As mentioned above, the nucleophile may be neutral and/or negatively charged. A nucleophile may react with or add to an electrophile, such as a stabilized imine compound, and may have lone pair(s) of electrons that will be attracted to electrophilic centers or moieties. If the nucleophile is a negatively charged component of a chemical compound, the counterbalancing positive charge or charges in the compound may be associated with an alkali metal, an alkaline earth metal, or a transition metal. For example, in one embodiment, a dicarbanion, such as a difunctional Grignard reagent (organomagnesium halide), such as MgBrCH$_2$(CH$_2$)$_3$CH$_2$MgBr, may add to a diimine to form a polymer. Generally, a difunctional or multifunctional compound, comprising at least two nucleophilic atoms, may be used to prepare a polymer such as a PA, and is illustrated as chemical structure 1 (example: difunctional). Chemical structure 2 represents a dithiol compound that may be used to prepare a poly(thioaminal) material, according to some embodiments of the disclosure.

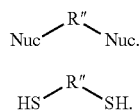

The R" of polymer B, and in the difunctional building blocks represented by chemical structures 1 and 2, may be a single atom, a chemical group, an oligomeric group, or polymeric segment. For example, in one embodiment, R" is a —CH$_2$— group, while in other embodiments, R" may a —(CH$_2$)$_6$— group, or R" may be polymeric, such as a polyester, polyether, or a polyolefin.

Polymer B and related polyaminal materials may include an R' group, which represents an atom, oligomer, or polymer that covalently links the aromatic rings. R' may include a heteroatom, such as oxygen, or heteroatoms that are part of a larger chemical group, such as organic group. R' may also include aliphatic or aromatic groups and/or chains, and may include electrically conjugated groups such as conjugated double bonded carbon groups. In one embodiment, R' may be a carbon atom that is bonded to other atoms or moieties, such as —CH$_3$ groups. In another embodiment, R' may be a hetero-organic polymeric group comprising one or more carbon atoms and heteroatoms such as oxygen and fluorine, such as a polyfluoroether. In further embodiments, R' may have conjugated groups, wherein the electrons may delocalize in a chemical group or along chain of atoms.

R' may be an electron accepting group or groups (EAGs). In another embodiment, R' may have one or more electron withdrawing groups (EWGs) containing electronegative atoms that may inductively attract electron density away from the neighboring aromatic rings. Importantly, EAGs and EWGs have been found to stabilize the imine moieties, and may be used to prepare the PA materials. Examples of EAGs and EWGs include, but are not restricted to the group consisting of: conjugated groups, aromatic groups, nitriles, carbonyls, nitro groups, nitroso groups, sulfones, sulfonates, electronegative heteroatoms, halogens, positively charged groups, and quaternary amine groups. In one example, difunctional aminobenzene compounds (which are electrophilic imine precursors) may be used to synthesize polymer B. As shown below, a difunctional aminobenzene compound, as represented in chemical structure 3, includes a generic R' group, while chemical structure 4, represents a difunctional aminobenzene compound, where R' includes —CF$_3$ EWGs.

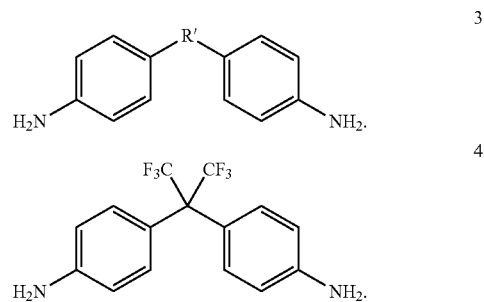

Notably, and in reference to structure 4, it was discovered by the inventors that difunctional aminobenzene compounds or aniline compounds with EWGs at R' will produce poly(thioaminal) materials of higher average molecular weights in contrast to the prior art. These aspects will be discussed later in the disclosure. We further note that in this disclosure, aminobenzene, phenylamine, and aniline are the same compound, and the nomenclature may be used interchangeably. However, reference to "an aminobenzene", "aminobenzenes", and "aminobenzene compounds" does not refer only to the single compound aminobenzene, but also includes all varieties of substituted aminobenzenes.

Referring once more to the polymer B structure or repeat unit, polymer B may also have "X" chemical groups or atoms that are covalently bonded to the aromatic ring(s), and wherein at least two X chemical groups in the repeat unit include a thioaminal linking segment —NH—CH$_2$—S—R"—S—. In another embodiment, three X groups include linking segments or functional groups that may form a crosslinked version of polymer B. The repeat unit of polymer B may additionally include at least two thioaminal group segments —NH—CH$_2$—S—R"—S—CH$_2$—, wherein each thioaminal group segment may be covalently bonded to a specific selected aromatic ring position to create structural isomers, such as ortho, meta, or para. The ring attachment point of a thioaminal group segment —NH—CH$_2$—S—R"—S—CH$_2$— may vary, such that the thioaminal group segment may be ortho, meta, or para in respect to the R' linking group. The difunctional aniline compounds 3 and 4, which are diimine precursors, may yield a poly(thioaminal) material wherein the thioaminal group segments —NH—CH$_2$—S—R"—S—CH$_2$— are para in respect to R'. Generally, the identity of the other X groups or atoms covalently attached to the aromatic ring of polymer B, excluding the thioaminal group segment(s), may include any chemical group, oligomer, or polymer. For example, in one embodiment, X is a hydrogen atom. In other embodiments, X may be a heteroatom such as oxygen, or heteroatoms that are part of another chemical group, or X may be a pendant aliphatic group, such as stearyl, lauryl, or cetyl, which may improve or aid polymer solubility in a non-polar solvent. Polarity and chain length of X groups may be selected to create desired solubility characteristics.

In further embodiments, X may include conjugated groups, wherein the electrons may delocalize in a chemical group or along chain of atoms, which was defined prior as electron accepting groups (EAGs). In another embodiment, X may have EWGs that contain electronegative atoms that may inductively attract electron density away from the aromatic ring(s). As mentioned above, EAGs and EWGs dinitro stabilized diimine may then be reacted with a dinucleophile, such as a dialkoxide, such as KO—$CH_2$—$(CH_2)_3$—$CH_2$—OK, to produce a polyaminal material, such as a polyoxoaminal.

As illustrated in reaction scheme 4, polyaminals, such as polymer B, and related polymers produced from stabilized imines, and containing EWGs, may be formed as follows:

Reaction scheme 4

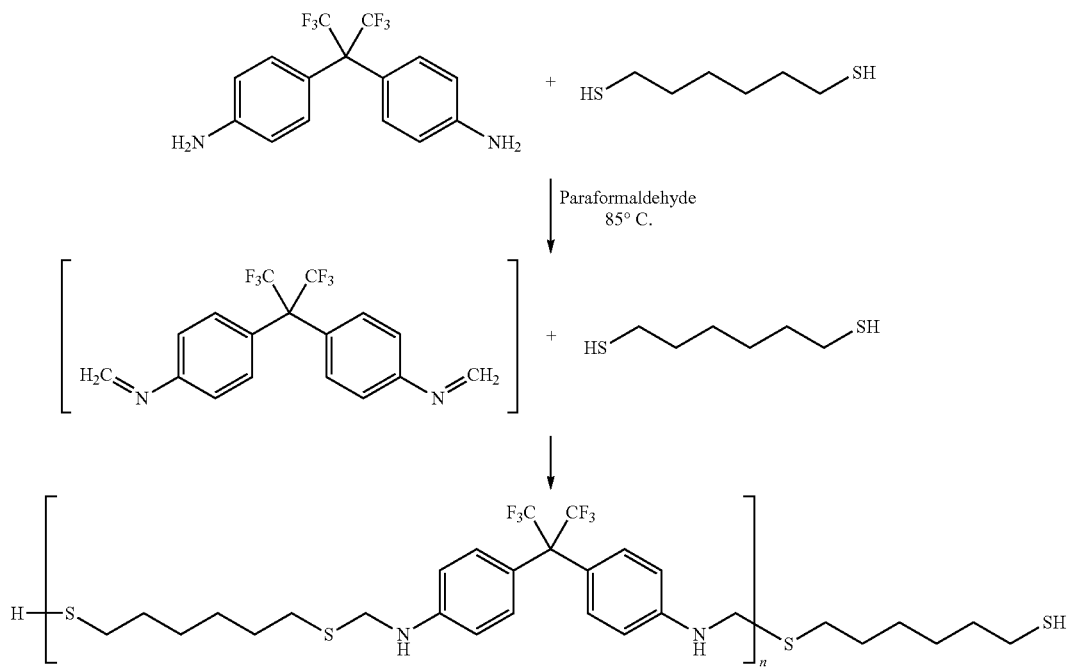

may be selected from the group consisting of: conjugated groups, aromatic groups, nitriles, carbonyls, nitro groups, nitroso groups, sulfones, sulfonates, electronegative heteroatoms, halogens, positively charged groups, and quaternary amine groups. To synthesize polymer B, or related polyaminal materials, difunctional aniline diimine precursor compounds comprising EAGs or EWGs may be used, as represented by chemical structures 5 and 6:

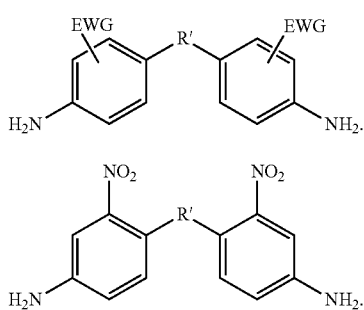

Chemical structure 5 represents a difunctional aniline diimine precursor compound wherein at least one hydrogen atom of each aromatic ring is replaced by an EWG. In one embodiment, chemical structure 6, a difunctional aniline diimine precursor compound containing two nitro EWGs, may be used to synthesize a dinitro stabilized diimine. The As shown in reaction scheme 4, a difunctional aniline diimine precursor compound, 4,4'-(hexafluoroisopropylidene)dianiline (FDADP), comprising —$CF_3$ EWGs, may be combined with paraformaldehyde (PF) and 1,6-hexanedithiol (HDT) in a ratio of about 1:1:2.5 (FDADP:HDT:PF) in a sealed and nitrogen purged reaction vessel. The reaction mixture may then be heated at a temperature from about 50° C. to about 150° C. for a time period from about 1 hour to about 24 hours, such as at a temperature of about 85° C. for about 18 hours. The reaction may be performed with or without solvent. The polymerization reaction as described is advantageously a "one-pot" synthesis, wherein a difunctional imine 4,4'-(hexafluoroisopropylidene)diimine) intermediate may be formed in situ upon exposure to paraformaldehyde, followed by reaction with 1,6-hexanedithiol to form the poly(thioaminal) material. In such a reaction, a diimine stabilized by —$CF_3$ EWGs, produces a high molecular weight poly(thioaminal) material ($M_w$=19,238 grams/mole $M_n$=10,689 grams/mole) as measured by gel permeation chromatography. In contrast, when similar chemical reactions are performed without dianiline, diimine precursors stabilized by —$CF_3$ EWGs, such as 4,4'-methylenedianiline (4,4'-diaminodiphenylmethane), only low molecular weight poly(thioaminal) materials ($M_w$=4,810 grams/mole $M_n$=2,658 grams/mole) may be isolated. In this disclosure, standard nomenclature for referring to molecular weight averages is used. Thus, $M_w$ means "weight-average molecular weight" and $M_n$ means "number-average molecular weight"

Reaction scheme 4 and related embodiments may also be performed in the presence of a solvent or a mixture of solvents if so desired. In some embodiments, a suitable polar aprotic solvent may be used such as N-methyl-2-pyrrolidone (NMP), dimethylsulfoxide (DMSO), N,N-dimethylformamide (DMF), N,N-dimethylacetamide (DMA), propylene carbonate (PC), and propylene glycol methyl ether acetate (PGMEA). The aforementioned polar solvents may be used to dissolve paraformaldehyde.

In other embodiments, a low polarity or non-polar aprotic solvent may be used to produce the poly(thioaminal) material or polyaminal material, such as tetrahydrofuran, dimethyl ether, methylene chloride, toluene, benzene, and kerosene. In this synthetic scheme, an initial operation involves the separate formation and isolation of an EAG/EWG stabilized multifunctional imine, such as a stabilized diimine. Advantageously, the stabilized diimine thus prepared and isolated may have a solubility in a low polarity or non-polar aprotic solvent, which may enable the practitioner to further control and/or manipulate the reaction conditions and tune the reactivity of the components, as a solvent may affect the reaction kinetics and/or thermodynamics, such as a stabilizing or destabilizing effect on the transition state of the reaction. In a subsequent operation of the embodiment, a stabilized diimine, such as 4,4'-(hexafluoroisopropylidene) diimine (comprising —$CF_3$ EWGs), may be combined with 1,6-hexanedithiol (HDT) in a ratio of about 1:1, in a sealed and nitrogen purged reaction vessel. Herein, the diimine may be dissolved in a suitable solvent at a chosen molarity, to the reaction vessel containing the dithiol, which itself may be dissolved in a suitable low polarity or non-polar aprotic solvent of a chosen molarity. The order and rate of addition of the components may be adjusted, and the reaction mixture may be heated at a temperature from about 50° C. to about 150° C., for a time period from about 1 hour to about 24 hours, such as at a temperature of about 85° C. for about 18 hours. The temperature of the reaction may be adjusted depending on the boiling point of the solvent, and/or if reflux conditions are desired. Isolation and purification of the poly(thioaminal) material or polyaminal material may be achieved by cooling, followed by precipitation and washing in a suitable solvent and drying. The polymer product may be re-dissolved in a suitable deuterated solvent for nuclear magnetic resonance experiments, such as DOSY-NMR and/or other 2D NMR techniques to analyze the polymer product and identify the peaks corresponding to the repeat unit moieties. Gel permeation chromatography (GPC) may also be used to determine the number average molecular weight of the substituted polymer.

Poly(Thioaminal) Thermal Scanning Probe Lithography Applications

Chemical structure 6 is representative of some embodiments of the poly(thioaminal) materials which may be synthesized according to the embodiments described above.

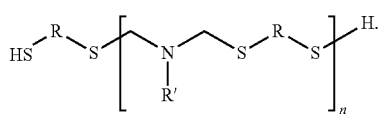

6

In one embodiment, each instance of R is independently selected from one or more of alkyl, aryl, and oligomer. Suitable oligomers include ether, siloxane, styrene, carbonate, lactide, methacrylate, acrylate, polyolefin, polyester, polyamide, polyamino, and combinations thereof, among others. In another embodiment, R' may be selected from one or more of $C_nF_{n+1}$, $C_nF_{n-1}$, $C_6H_4X$, and heterocyclyl thereof, among others. X may be selected from one or more of of Br, Cl, $NO_2$, $CF_3$, F, $CO_2Me$, $CO_2H$, CN, and combinations thereof, among others.

The poly(thioaminal) material may be utilized to improve patterning processes performed on substrates, such as semiconductor substrates and the like. As technology transistor nodes advance, nanoscale patterning processes are desirable. It is contemplated that thermal scanning probe lithography processes may provide for nanoscale patterning commensurate with advanced technology nodes. In one embodiment, the poly(thioaminal) materials described herein may be advantageously utilized as a thermal resist in thermal scanning probe lithography processes.

Generally, thermal scanning probe lithography utilizes a heated scanning probe microscope tip with an apex radius of less than about 20 nm, such as less than about 10 nm. A substrate to be patterned may be positioned on a moveable stage and the probe tip is brought into contact with a thermal resist disposed on the substrate. In one embodiment, the poly(thioaminal) material may be disposed as a thermal resist on the substrate via a spin-on process. The spin on process may generally include delivering the poly(thioaminal) material to the substrate and spinning the substrate such that the poly(thioaminal) material spreads out to cover the surface of the substrate. Other suitable polymer deposition processes may also be utilized. Upon contact by the probe tip, the poly(thioaminal) thermal resist may volatilize into one or more monomers and be removed from the substrate. As a result, three dimensional relief patterns may be formed in the poly(thioaminal) thermal resist. The patterns formed in the thermal resist may be influenced by the temperature of the probe tip and the force applied by the probe on the thermal resist.

Reaction scheme 5 is representative of the volatilization of the poly(thioaminal) material in response to thermal stimuli.

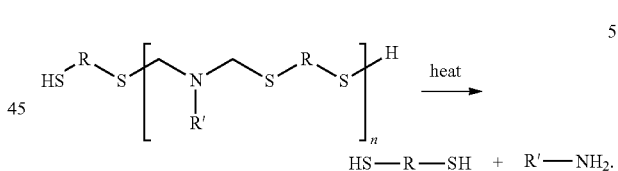

5

Monomers volatilized upon exposure to the thermal stimuli include diothiol materials (i.e. HS—R—SH), electron deficient amines, (i.e. R'—$NH_2$) and combinations thereof. In addition, carbon atoms not included in the dithiol materials or the electron deficient amines may also be volatilized. While not wishing to be bound by theory, it is believed that these carbon atoms may react to form various hydrocarbon compounds, such as ethylene and the like. Formaldehyde may also be formed as a reaction product in the presence of water or water vapor. For example, water vapor present in the processing environment may be sufficient to facilitate formation of formaldehyde with the volatilized carbon. It is also contemplated that chemical stimuli may be utilized to volatilize monomers from the poly(thioaminal) material.

In one embodiment, the thermal stimuli provided by the probe may be sufficient to evaporate the poly(thioaminal material). In addition, the thermal stimuli may be configured to prevent flowing of the polymer which may degrade a desired pattern. For example, a difference in temperature between the poly(thioaminal) thermal resist and the probe may be greater than about 200° C. In one embodiment, the temperature of the probe may be greater than about 225° C. if the substrate and poly(thioaminal) material temperature is maintained at room temperature (i.e. about 20° C.). In one embodiment, the probe may be maintained at a temperature of greater than about 225° C. during the patterning process. It is contemplated that the poly(thioaminal) material may undergo near quantitative decomposition above about 225° C. As a result, controlled patterning of the poly(thioaminal) material may be achieved. In addition, residual deposition on the probe tip may be reduced or prevented because the temperature of the probe is sufficient to decompose the poly(thioaminal) material and volatilize the decomposition products. As such, the nanoscale specificity of the probe tip may be maintained over prolonged thermal scanning probe lithography processes.

The large monomer set density of the poly(thioaminal) material may also be utilized to tune various properties of the thermal resist. For example, each instance of R may be selected to tune a glass transition temperature (Tg) of the poly(thioaminal) material. The Tg is generally defined as a temperature at which a material solidifies or predominantly exhibits characteristic of a solid. In one embodiment, R moieties may be selected to reduce or prevent viscosity of the poly(thioaminal) material at room temperature. In one embodiment, R may be a dithioerythritol adduct or other similar material. If the poly(thioaminal) material is synthesized via the imine route, the utilization of relatively "short", or low molecular weight, dithiol materials, together with the aromatic diamine, may result in an improved Tg. The improved Tg may provide for a poly(thioaminal) material having a reduced viscosity. Examples of dithiols may include materials generally represented by the structure HS—R—SH. In this embodiment, R may be alkyl $C_1$-$C_6$ or the like. In another embodiment, each instance of R in the poly(thioaminal) material may be a material including aromatic moieties or hydroxyl moieties. In this embodiment, the rigidity and crystallinity of the poly(thioaminal) material may be increased.

Advantageously, the poly(thioaminal) material may be disposed on the substrate and flowing of the thermal resist may be reduced to achieve a more uniform layer suitable for thermal scanning probe lithographical processes. In another embodiment, R moieties may be selected such that the poly(thioaminal) material has a softening point of between about 40° C. and about 50° C. It is contemplated that the R moieties may also be selected to increase the softening point of the poly(thiominal) material above 50° C.

Another aspect of the large monomer set density is the ability to select the size or molecular weight of monomers to be volatilized. It is contemplated that relatively small R moieties may provide for improved pattern resolution upon volatilization. For example, line edge roughness and/or line width roughness may be reduced when "smaller" monomers are volatilized when compared to "larger" monomers. In one embodiment, propanedithiol may be volatilized upon exposure to the heated probe and a resulting pattern in the poly(thioaminal) material may exhibit improved relief resolution (i.e. smoother thermal resist sidewalls). Other suitable "small" monomers which have a molecular weight less than hexanedithiol may also be utilized. Examples, of such material may include butanedithiol and ethanedithiol, among others. Subsequent etching processes may benefit from the improved resolution as the ultimate etching of the substrate is dependent upon characteristics of the pattern.

The poly(thioaminal) material may also exhibit desirable stability in solution. For example, the poly(thioaminal) material may be synthesized in bulk and may not decompose for extended periods of time (i.e. longer than a week). This may allow operators to more efficiently deploy the poly (thioaminal) material as a resist for thermal scanning probe lithography applications. Similarly, the poly(thioaminal) material may also exhibit improved etch selectivity when compared to conventional thermal resists. As a result, subsequent etching of deprotected regions of the substrate may be improved.

While the foregoing is directed to embodiments of the present disclosure, other and further embodiments of the disclosure may be devised without departing from the basic scope thereof, and the scope thereof is determined by the claims that follow.

What is claimed is:

1. A method of patterning a substrate, comprising:
    forming a poly(thioaminal) material by either (a) ring opening of a hexahydrotriazine with a thiol, or (b) reacting a stabilized imine intermediate with a thiol;
    disposing the poly(thioaminal) material on a substrate; and
    patterning the poly(thioaminal) material with a thermal scanning probe.

2. The method of claim 1, wherein the poly(thioaminal) material is disposed on the substrate by a spin coating process.

3. The method of claim 1, wherein the thermal scanning probe contacts the poly(thioaminal) material during the patterning.

4. The method of claim 3, wherein the thermal scanning probe is maintained at a temperature of greater than about 225° C. during the patterning.

5. The method of claim 4, wherein monomers of the poly(thioaminal) material are volatilized upon contact with the thermal scanning probe.

6. The method of claim 5, wherein the monomers are one or more of a dithiol, an electron deficient amine, or combinations and mixtures thereof.

7. The method of claim 1, wherein a temperature difference between a bulk of the poly(thioaminal) material and the thermal scanning probe is greater than about 200° C.

8. The method of claim 1, wherein the stabilized imine intermediate is synthesized from an electron deficient amine.

9. The method of claim 1, further comprising:
    etching deprotected regions of the substrate after performing the patterning.

10. A method of patterning a substrate, comprising:
    forming a poly(thioaminal) material by either (a) ring opening of a hexahydrotriazine with a thiol, or (b) reacting a stabilized imine intermediate with a thiol, the poly(thioaminal) material having a $CH_2$—N(R')—$CH_2$—S—R—S repeating group, wherein:
        each instance of R is selected from the group consisting of alkyl, aryl, and oligomer, and
        each instance of R' is an electron withdrawing group selected from the group consisting of $CnF_{n+1}$, $CnF_{n-1}$, $C_6H_4X$, and heterocyclyl thereof, and wherein X is selected from the group consisting of Br, Cl, $NO_2$ $CF_3$, F, $CO_2Me$ $CO_2H$, CN, and combinations thereof;
    disposing the poly(thioaminal) material on a substrate; and
    patterning the poly(thioaminal) material with a thermal scanning probe.

11. The method of claim 10, wherein each instance of R is an oligomer selected from the group consisting of ether, siloxane, styrene, carbonate, lactide, methacrylate, acrylate, polyolefin, polyester, polyamide, polyamino, and combinations thereof.

12. The method of claim 10, wherein the thermal scanning probe is maintained at a temperature of greater than about 225° C. during the patterning.

13. The method of claim 12, wherein a temperature difference between a bulk of the poly(thioaminal) material and the thermal scanning probe is greater than about 200° C.

14. The method of claim 10, wherein dithiol monomers, electron deficient amines, and combinations thereof are volatilized from the poly(thioaminal) material during the patterning.

15. The method of claim 10, further comprising:
etching deprotected regions of the substrate after performing the patterning.

16. The method of claim 10, wherein each instance of R is selected to tune a glass transition temperature of the poly(thioaminal) material.

17. The method of claim 10, wherein each instance of R includes aromatic substituents, hydroxyl substituents, or combinations thereof.

18. The method of claim 10, wherein each instance of R is

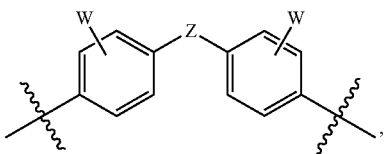

wherein each W is independently hydrogen or an electron withdrawing group, and Z is selected from the group consisting of $CH_2$ and $C(CF_3)_2$.

19. A method of patterning a substrate, comprising:

forming a poly(thioaminal) material by either (a) ring opening of a hexahydrotriazine with a thiol, or (b) reacting a stabilized imine intermediate with a thiol, the poly(thioaminal) material having a S—$CH_2$—NH—R—NH—$CH_2$ repeating group, wherein each instance of R is selected from the group consisting of alkyl, aryl, and oligomer;

disposing the poly(thioaminal) material on a substrate; and patterning the poly(thioaminal) material with a thermal scanning probe.

20. The method of claim 19, wherein each instance of R is selected from the group consisting of siloxane, styrene, carbonate, lactide, methacrylate, acrylate, polyamide, polyamino,

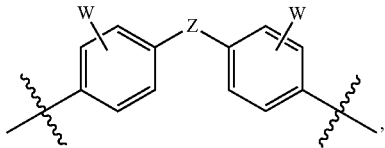

and combinations thereof, wherein each W is independently hydrogen or an electron withdrawing group, and Z is selected from the group consisting of $CH_2$ and $C(CF_3)_2$.

* * * * *